(12) United States Patent
Locker

(10) Patent No.: US 8,174,327 B2
(45) Date of Patent: May 8, 2012

(54) METHOD AND SYSTEM FOR CONFIGURATION OF A PHASE-LOCKED LOOP CIRCUIT

(75) Inventor: Kevin Locker, Scottsdale, AZ (US)

(73) Assignee: NXP B.V., Eindhoven (NL)

( * ) Notice: Subject to any disclaimer, the term of this patent is extended or adjusted under 35 U.S.C. 154(b) by 295 days.

(21) Appl. No.: 12/296,997

(22) PCT Filed: Apr. 12, 2007

(86) PCT No.: PCT/IB2007/051313
§ 371 (c)(1),
(2), (4) Date: Oct. 13, 2008

(87) PCT Pub. No.: WO2007/116379
PCT Pub. Date: Oct. 18, 2007

(65) Prior Publication Data
US 2009/0261910 A1   Oct. 22, 2009

Related U.S. Application Data

(60) Provisional application No. 60/791,631, filed on Apr. 12, 2006.

(51) Int. Cl.
H03L 7/00 (2006.01)
(52) U.S. Cl. ............ 331/34; 331/16; 375/376; 327/115; 327/117; 377/47; 377/48
(58) Field of Classification Search ............ 331/1 A, 331/16, 34; 375/376; 327/141, 156, 158, 327/115, 117; 377/47, 48
See application file for complete search history.

(56) References Cited

U.S. PATENT DOCUMENTS

| 5,146,186 | A |   | 9/1992  | Vella |
|-----------|---|---|---------|-------|
| 5,267,189 | A |   | 11/1993 | Wilke |
| 5,973,525 | A | * | 10/1999 | Fujii ............................. 327/158 |
| 5,977,836 | A |   | 11/1999 | Swan et al. |
| 7,026,878 | B2| * | 4/2006  | Smith ........................... 331/1 A |
| 7,042,258 | B2| * | 5/2006  | Booth et al. .................. 327/115 |
| 7,298,218 | B2| * | 11/2007 | Ghazali et al. .................. 331/16 |
| 2002/0036544 | A1 | * | 3/2002 | Jackson et al. ............... 331/1 A |
| 2003/0002055 | A1 |   | 1/2003 | Kilthau et al. |
| 2006/0197605 | A1 | * | 9/2006 | Hirano et al. ................... 331/16 |
| 2007/0182611 | A1 | * | 8/2007 | Yu ................................. 341/143 |

FOREIGN PATENT DOCUMENTS

| EP | 1030453 | 8/2000 |
| JP | 11-055118 A | 2/1999 |
| JP | 2001-320275 A | 11/2001 |

OTHER PUBLICATIONS

Wang, Wenqin; "Designing One High Performance Signal Generator Based on Triple Tuned Algorithm"; Microwave Conference Proceedings, 2005; APMC 2005; Asia-Padific Conference Proceedings Suzhou, China Dec. 4-7, 2005; Piscataway, NJ USA; IEEE, Dec. 4, 2005, pp. 1-4, XP01092529; ISBN: 0-7803-9433-X.

* cited by examiner

Primary Examiner — Arnold Kinkead
Assistant Examiner — Richard Tan

(57) ABSTRACT

Example embodiments are directed toward configuration of a phase lock loop (PLL) circuits for low power operation. In particular embodiments, a fraction related to a desired gain of a PLL circuit is determined. A set of possible frequency-divider values and a set of possible feedback divider values are determined. A PLL configuration is selected from a combination of the sets of frequency divider and feedback divider values that forms a ratio indicated the determined fraction.

17 Claims, 3 Drawing Sheets

METHOD AND SYSTEM FOR CONFIGURATION OF A PHASE-LOCKED LOOP CIRCUIT

The present invention relates generally to phase-locked loops and, more particularly, to programmable phase locked loops having multiple divider circuits.

A phase-locked loop (PLL) is a circuit that generates a periodic output signal having a constant phase relationship with respect to a periodic input signal. PLLs are widely used in many types of measurement, microprocessor, and communication applications. PLL designers often have a major challenge with regard to implementing PLLs that have complex operational constraints. This can be particularly difficult where the PLL settings are subject to real-time changes.

A PLL is typically used to generate an output signal after acquiring the frequency and the phase of an input signal for purposes of synchronization. Although the frequency of the output signal is ultimately locked onto the frequency of the input signal, there exists a static phase offset, also known as static offset error, between the input signal and the output signal. A Phase Frequency Detector (PFD) is used to compare the phase error and frequency between the input and output signals. The trains of the pulses generated by the PFD are proportional to the phase error and provided to a charge pump, the output of which is integrated in a loop filter, whose output controls a Voltage-Controlled Oscillator (VCO) or a Current-Controlled Oscillator (CCO).

The VCO/CCO generates the periodic output signal. If the clock edges from the VCO/CCO (called the feedback edges) fall behind those of the input signal, the phase comparator causes the charge pump to change the control voltage, so that the oscillator speeds up. Likewise, if the feedback edges creep ahead of those of the reference clock, the phase comparator causes the charge pump to change the control voltage to slow down the oscillator. The low-pass filter smoothes out the abrupt control inputs from the charge pump, so that the system tends towards a state where the phase detector makes very few corrections.

PLLs often include frequency divider circuits used to control the frequency of signals used by the various components of the PLL circuit. One such frequency divider circuit is a divide by N circuit (pre-divider) between the reference signal and the reference signal input to the phase comparator. The divide by N circuit sends through one out of every N pulses (N being an integer), where N is usually programmable. Absent other factors, the effect of the divide by N circuit is that when the PLL locks, the reference signal is N times faster than the VCO/CCO output.

Another divider circuit is a divide by M circuit (feedback-divider) between the VCO/CCO and the feedback input to the phase comparator. The divide by M circuit sends through one out of every M pulses (M being an integer), where M is usually programmable. The effect of the divide by M circuit is that when the PLL locks, the VCO/CCO is going M times faster than the reference input at the phase comparator.

Another divider circuit is a divide by P circuit (post-divider) between the VCO/CCO and the output of the PLL circuit. The divide by P circuit sends through one out of every P pulses (P being an integer), where P is usually programmable. The effect of the divide by P circuit is that the VCO/CCO output is P times faster than the PLL output.

One challenge to the operation of phase-locked loops involves determining the optimal settings for the various phase-locked loops components, along with real-time modification of the phase-locked loops settings. These and other limitations present challenges to the implementation of phase-locked loops.

Various aspects of the present invention are applicable to a method for use with a PLL circuit and to determine a low power configuration for the PLL circuit. A subset of first frequency-divider configuration values are determined from a range of possible first frequency-divider configuration values. A fraction related to a desired gain of the PLL circuit is determined based upon the subset of first frequency-divider configuration values. A further determination is made as to whether the fraction can be represented using the subset of first frequency-divider configuration values and a range of possible feedback-divider configuration values. Where the fraction can be represented and based upon the fraction, computing a set of values for the first frequency-divider configuration value and a set of values for the feedback-divider configuration value. A set of values are selected from the sets of values based upon at least one of the desired PLL circuit characteristics.

Consistent with another example embodiment, the present invention is directed to a PLL configuration system having an input for receiving phase-locked loop characteristics, an output for providing PLL configuration data and a circuit arrangement for determining the PLL configuration data for a PLL circuit. The PLL circuit has a first frequency-divider, a feedback-divider and a fractional-N mode. The circuit arrangement determines a low power configuration for the PLL circuit which meets a set of received PLL circuit characteristics. A subset of first frequency-divider configuration values are selected from a range of possible first frequency-divider configuration values. A fraction is determined that corresponds to a desired gain of the PLL circuit and is based upon the subset of first frequency-divider configuration values. It is determined whether the fraction can be represented using the subset of first frequency-divider configuration values and a range of possible feedback-divider configuration values. In response to the determination as to whether the fraction can be represented and based upon the fraction, a set of values are computed for the first frequency-divider configuration value and for the feedback-divider configuration value. A set of values are selected from the sets of values based upon at least one of the desired PLL circuit characteristics.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

The invention may be more completely understood in consideration of the following detailed description of various embodiments of the invention in connection with the accompanying drawings, in which.

Figure 1:
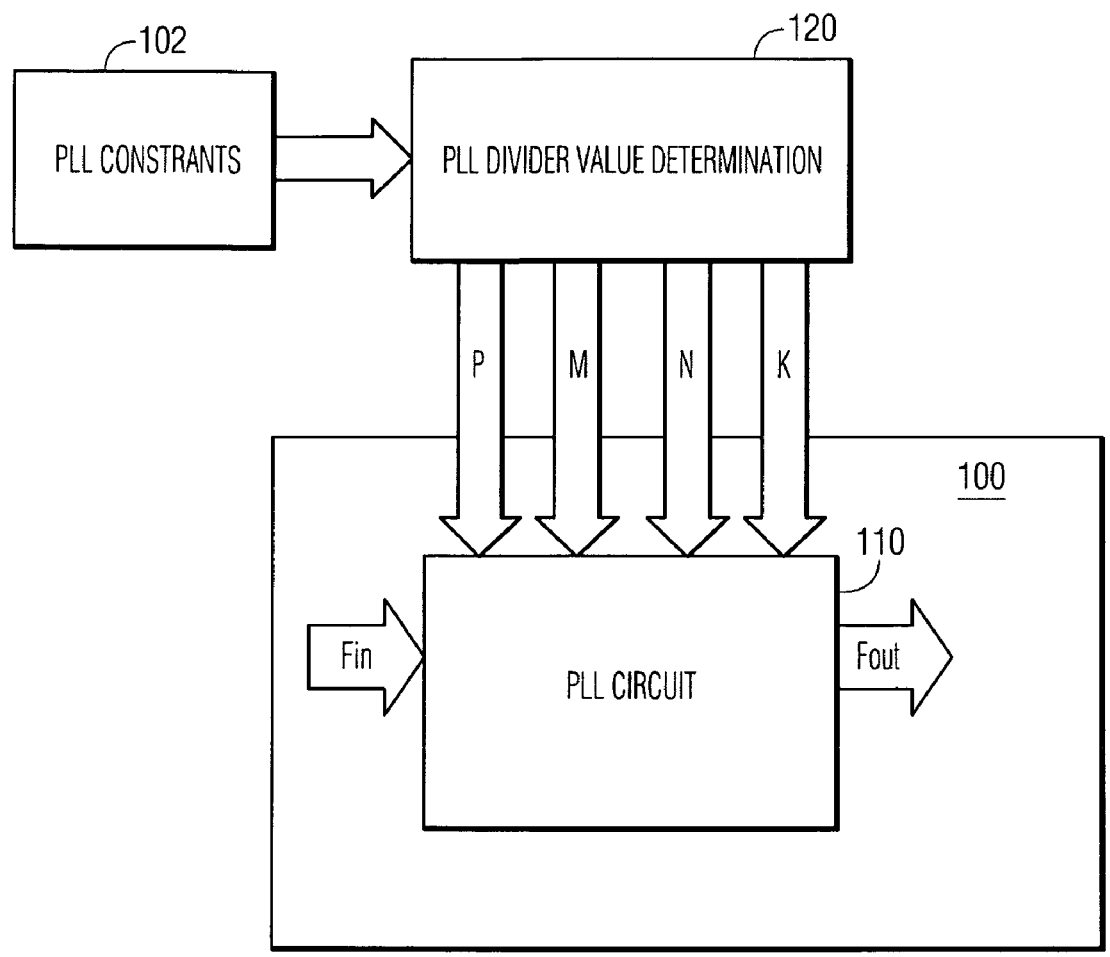
FIG. 1 is block diagram of a PLL system, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

The present invention is believed to be applicable to a variety of circuits and approaches involving electronic communications, frequency multiplication, frequency tracking, signal synthesis, and other approaches using active feedback and/or control. While the present invention is not necessarily limited to such applications, an appreciation of various aspects of the invention is best gained through a discussion of examples in such an environment.

PLL frequency synthesizers are important building blocks in communication and computing systems. Frequency translation in radio-frequency (RF) transceiver circuits and clock generation in computing systems both typically use accurate, high performance PLL systems.

Consistent with one example embodiment, a method involves determining the pre-divider (N), post-divider (P), feedback-divider (M) values to be used by a PLL circuit. If necessary, a fractional-N (K) representing a fractional divider mode is also determined. These divider-values are determined based in part upon the particular desired characteristics of a PLL circuit, such as the power consumption of the circuit or the input and output frequencies of the PLL circuit. The method facilitates the process of determining the divider-values by limiting the possible range of at least some of the PLL values to be determined. In situations where the desired PLL functionality cannot be realized by using only the N, P and M values, a K value is determined to realize the desired functionality.

In a typical system, the PLL divider-value determination is performed using a processor or electrical circuit. For instance, software code can be implemented using a processor and memory to determine the PLL divider values; alternatively, an electrical circuit can be configured to perform a similar function.

The ratio between the Fin and Fout frequency (Fout/Fin) is sometimes referred to as the gain of the PLL because the ratio represents the change in the frequency between Fin and Fout. The gain of a typical PLL is controlled using divider-circuits, each of which is capable of modifying the frequency of an internal signal of the PLL. Circuit characteristics of a typical divider-circuit limit the frequency divide abilities of divider-circuits to integer values within a specific range of values. Thus, the gain of the PLL circuit can be expressed as a fraction whose numerator and denominator are derived from the integer divider values.

A simplified block diagram is shown in FIG. 1, illustrating a system including a PLL system (100) and a PLL divider-value determination device (120), in accordance with the present invention. PLL system (100) includes a PLL circuit (110) for producing a signal having an output frequency Fout derived from an input frequency Fin. The PLL divider-value determination limits the range of values of at least one of the P, M or N clock divider inputs to the PLL circuit. Ideally, the range is limited for the clock divider input that has the most impact on the PLL-circuit characteristic for which the PLL circuit is being optimized for.

The relevant PLL circuit constraints (102) are provided to the PLL divider-value determination device. In one embodiment, the constraints (102) are input into a computer which implements the divider-value determination using software and a processor. In an alternate embodiment, the constraints (102) are input to a circuit that is configured to output divider-values (phase-locked loop configuration data) consistent with the present invention. The inputs may be manually provided by a user, or the inputs may be real-time inputs from a circuit or the like. The outputs may be implemented using a display (e.g., a monitor or a printout) or by providing an output signal to a PLL circuit or device, such as through an inter-integrated circuit bus or the like.

The divider-values from the PLL divider-value determination device (120) are then used to configure the PLL circuit (110). In one embodiment, the PLL circuit may be configured by designing the PLL circuit to conform to the divider-values. In another embodiment, the PLL circuit can be configured using a programmable PLL device. The PLL divider-value determination device (120) can either output the divider-values to a person who then programs the programmable PLL device or device (120) can automatically configure programmable PLL device. In one such embodiment, the PLL divider-value determination device (120) is capable of real-time configuration of the programmable PLL device.

Figure 1A:
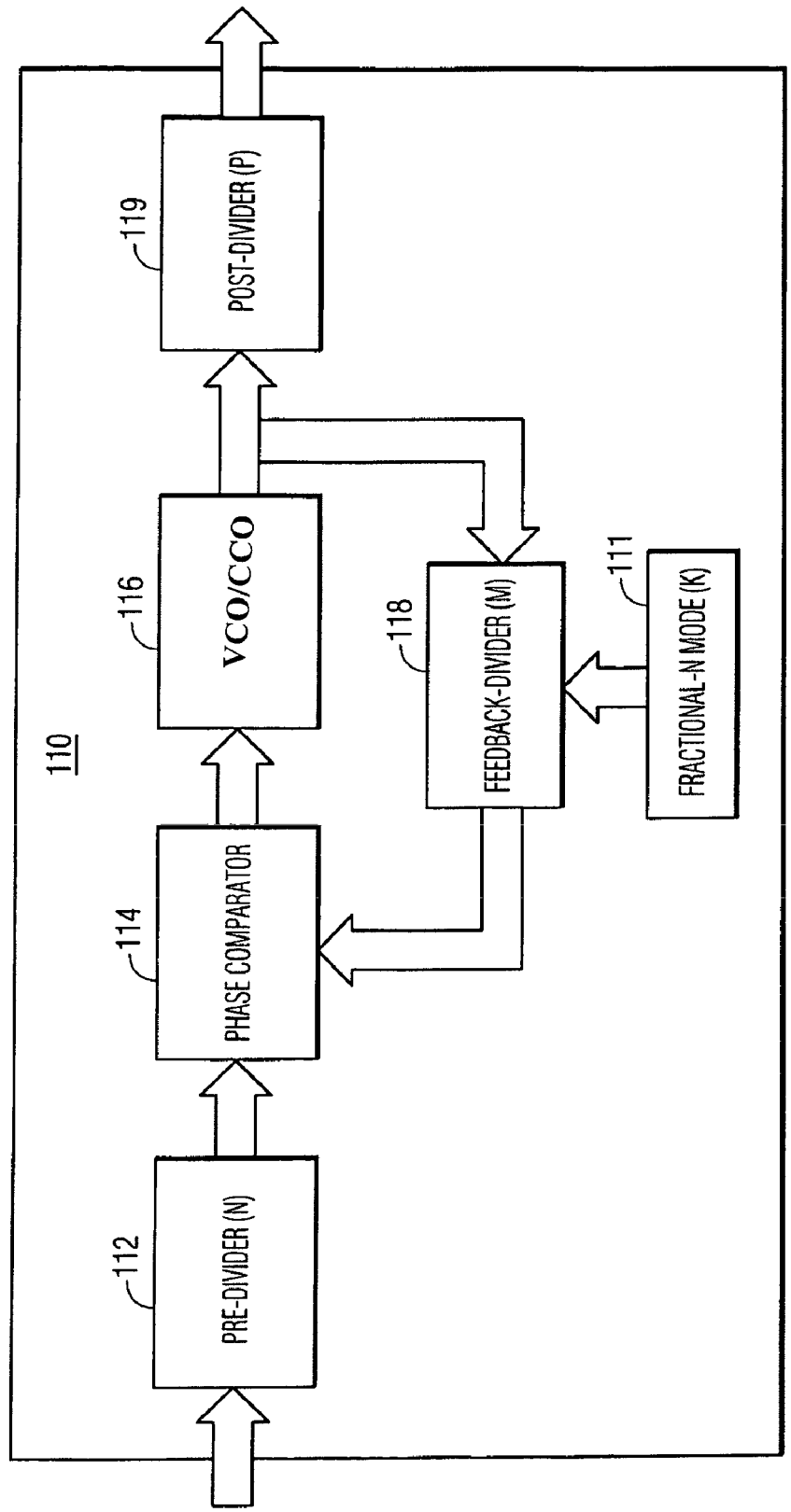
FIG. 1A is block diagram of a PLL circuit, according to an example embodiment of the present invention.

FIG. 1A depicts a block diagram of an example PLL device that can be configured using the present invention. FIG. 1A includes a depiction of signal dividers (112, 118 and 119), a phase comparator (114), a voltage (or current) controlled oscillator (116), and a fractional-N mode (111).

Typically, each of the signal dividers divides the frequency of a received signal by an integer multiple as depicted by blocks 112, 118 and 119 by the variables N, M and P, respectively. Thus, the gain of this particular circuit would be equal to approximately M/(N*P). Many programmable PLL devices limit the values of M, N and P to a finite set of integers. Therefore, the granularity of the possible circuit gains is limited by the range of values of the signal dividers, and as a result, some gains can be realized using only M, N and P values. In addition, some gains are represented using an irrational number, and as such, cannot be represented using integer values of M, N and P. To approximate a gain which cannot be represented using M, N and P values, the circuit of FIG. 1A implements a fractional-N mode as depicted by block 111. This fractional-N mode is used to alternate the value of one of the signal dividers between two integer values. For instance, fractional-N mode may be used to vary the integer value of the feedback-divider in a pseudo-random manner such that the average feedback-divider value is equal to a desired fractional value.

Figure 1B:
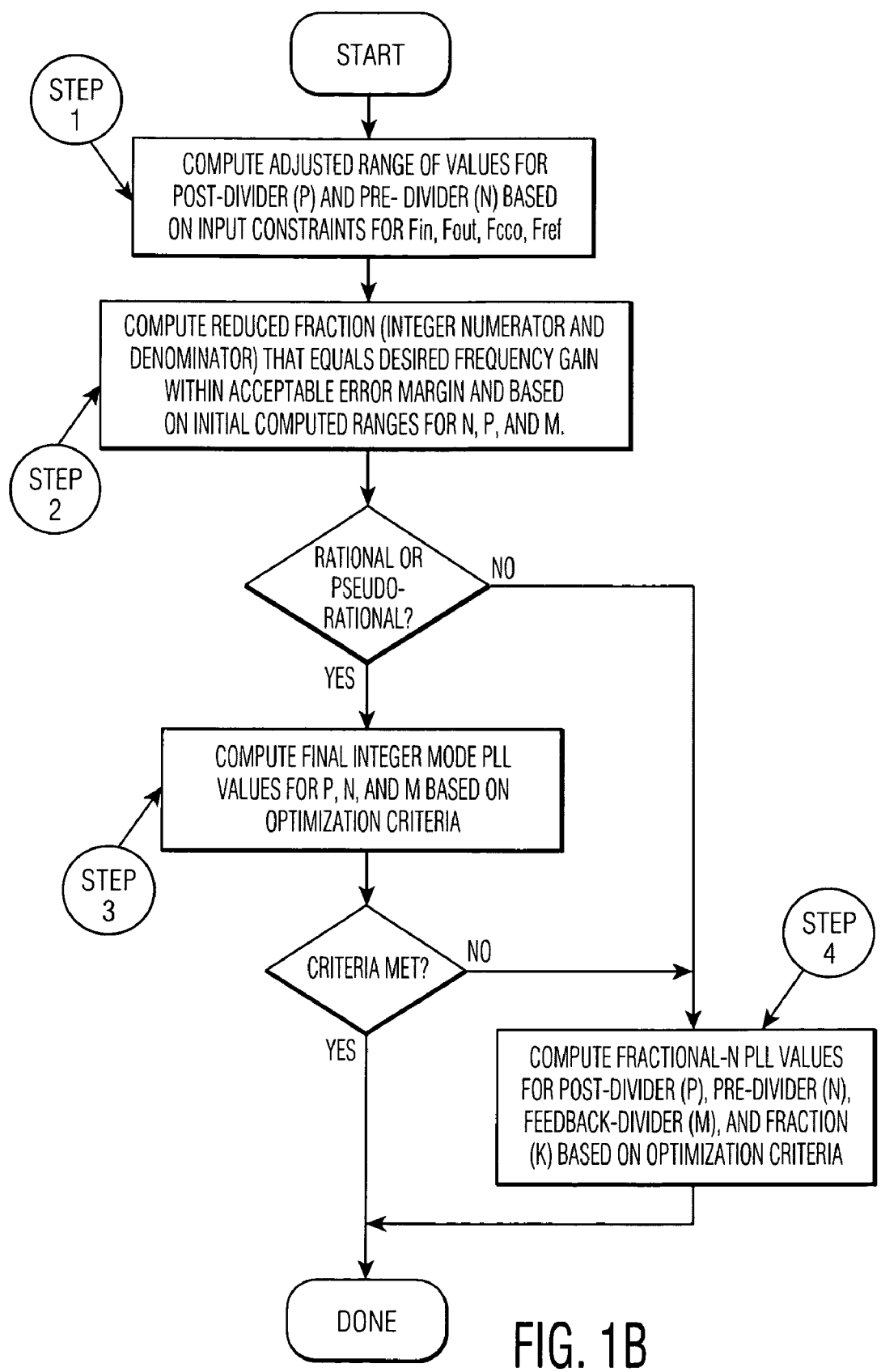
FIG. 1B is a flow chart illustrating a method of determining configuration information for a PLL circuit, according to an example embodiment of the present invention.

FIG. 1B shows an embodiment for a method of determining the divider-circuit values, according to an example embodiment of the present invention. In one such embodiment, during step 1 a processor or electrical circuit computes range limits on pre-divider (N) and post-divider (P) parameters by making use of a set of user constraints in Fcco and Fref and PLL design constraint equations. These equations are characteristic of the particular PLL design and define the relationship between P, Fcco, Fout and between N, Fref, and Fin. By initially reducing the possible values for N and P, subsequent steps can be executed more quickly. For example, a typical PLL might have the following characteristic equations:

$$Fout=Fcco/2P,$$

where Fout is the output frequency of the PLL and Fcco is the frequency of the current-controlled oscillator in the PLL; and $$Fref=Fin/N,$$

where Fref is the reference frequency input to the phase frequency detector and Fin is the input frequency to the PLL.

Fcco has a range that is limited by the PLL design and is typically a significant contributor to overall power dissipation in the PLL. For this reason, in low power applications it is sometimes desirable to constraint Fcco to the lowest end of possible frequencies. For example, if the PLL design limits Fcco to a range of 100 MHz and 200 MHz, constraining Fcco to a value between 100 MHz and 125 MHz will drive the algorithm to select lower power PLL settings. Similarly, lower values for Fref reduce power consumption but since Fref is generally a much lower frequency than Fcco, the effect is significantly less. PLL lock time is inversely related to Fref and the constraint on Fref must be within the PLL design parameters and usually corresponds to the minimum acceptable lock time.

Given these constraints on Fcco and Fref and the desired Fin and Fout frequencies, the corresponding ranges for N and P can be computed using the PLL characteristic equations.

The desired frequency gain Fout/Fin may be a rational number, irrational number, or pseudo-rational number. A rational number can be expressed as a fraction with integer numerator and denominator. An irrational number cannot be expressed as an integer fraction. A pseudo-rational number can be approximately represented as an integer fraction (within an acceptable error). Since most systems can tolerate a certain margin of frequency error, a pseudo-rational number is treated as a rational number for purposes of determining optimal PLL settings.

A processor or electrical circuit determines a reduced fraction corresponding to the desired frequency gain as depicted by step 2. The reduced fraction can be found using, for example, an algorithm designed to determine fractional approximations of the gain. One such algorithm computes successively more accurate fractional approximations of a given number X (gain). The equation for each successive fractional approximation $A_k$ is:

$D_k$=integer(X) for k=2 and $(1/(X-A_{k-1}))$ for subsequent values of k;

$$T_k=D_k*T_{k-1}+T_{k-2};$$

$$B_k=D_k*B_{k-1}+B_{k-2};$$

$$A_k=T_k/B_k;$$

Where,
k=2, 3, 4, . . . ;
$D_k$=integer part of the inverse of the difference between the original number X and the previous approximation;
$T_k$=numerator of current iterative approximation;
$B_k$=denominator of current iterative approximation;

The iterative loop must be initialized with $T_0$=0, $B_0$=1, $T_1$=1, $B_1$=0. The loop terminates when the difference between the original number X and the approximation $A_k$ is less than the acceptable frequency error or when the values of $T_k$ and $B_k$ are too large to be realized by the valid range of values determined for N, P, and M. In the first case, the frequency gain is rational or pseudo-rational and the algorithm progresses to step 3 to determine the final integer mode settings. In the later case, the gain is considered irrational and the algorithm moves to step 4 where the Fractional-N mode settings are computed.

Once an integer numerator and denominator have been determined whose quotient is equal to the desired frequency gain, a trial-based procedure is used to determine valid N, P, and M values that produce this gain X. The characteristic gain equation for a typical PLL is:

$$X=M/(N*P)$$

From step 2, an integer numerator (T) and denominator (B) have been determined equal to the frequency gain leading to:

$$T/B=M/(N*P)$$

$$T*m1=M$$

$$B*m2=N*P$$

(Where: m1=m2=m)

Using these or similar equations, the processor or electrical circuit computes a maximum value for the multipliers m1 and m2 using the valid range for M and the adjusted ranges for N and P determined in step 1. For instance, the maximum numerator multiplier can be determined using the formula, $m1_{max}=M_{max}/T$ and the maximum denominator multiplier can be determined using the formula, $m2_{max}=N_{max}*P_{max}/B$. The lesser of the multipliers $m1_{max}$ and $m2_{max}$ is selected for a multiplier value "m". The minimum multiplier value is 1. Since lowest power is achieved with the smallest P and largest m values within their determined min/max ranges, a loop is implemented that iteratively selects sequentially larger P values and sequentially smaller m values. These loops iterate until an integer value for N is found using the denominator equation. The value of m that results in the first integer value found for N is then used in the numerator equation to compute a value for M. Once valid N, P and M values have been computed, the algorithm is finished.

If no integer value for N is found within the valid range of values for M and P or if the computed value for M exceeds the permissible range of M, the algorithm proceeds to step 4 where the Fractional-N mode is invoked. The Fractional-N mode step computes the values for N, P, M, and K that achieve the desired gain while maintaining low power consumption. Using the gain equation discussed above and substituting small P and large N values, the irrational value of M can be determined, i.e., Mi=X*Psmall*Nlarge.

Accordingly, the PLL setting for the Fractional-N mode are:
N=Nlarge
P=Psmall
M=integer(Mi)
K=Mi−integer(Mi)

As discussed above, the Fractional-N mode may then be used to vary the integer value of the feedback-divider in a pseudo-random manner such that the average feedback-divider value is equal to the irrational value of Mi.

In an alternate embodiment, various implementations of the invention discussed herein can be used for configuring a PLL circuit having only a pre-divider and a feedback-divider or only a post-divider and a feedback-divider. The process is implemented by setting the value of the absent divider to a value of 1 or by restricting the acceptable range of the absent divider to 1. The aforementioned processes are then carried out to determine the divider values for the divider circuits which are present.

The various embodiments described above and shown in the figures are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For instance, applications other than power reduction may be amenable to implementation using similar approaches. In addition, one or more of the above example embodiments and implementations may be implemented with a variety of approaches, including digital and/or analog circuitry and/or software-based approaches. The above example embodiments and implementations may also be integrated with a variety of circuits, devices, systems and approaches including those for use in connection with memory transfer, communications, guidance control, and frequency tracking. These approaches are implemented in connection with various example embodiments of the present invention. Such modifications and changes do not depart from the true scope of the present invention that is set forth in the following claims.

The invention claimed is:

1. For use with a phase-locked loop circuit having a first frequency-divider, a feedback-divider and a fractional-N mode, a method for determining a low power configuration for the phase-locked loop circuit which meets a set of desired phase-locked loop circuit characteristics, the method comprising the steps of:
   determining a subset of first frequency-divider configuration values from a range of possible first frequency-divider configuration values;
   determining a fraction corresponding to a desired gain of the phase-locked loop circuit and based upon the subset of first frequency-divider configuration values;
   determining whether the fraction can be represented using the subset of first frequency-divider configuration values and a range of possible feedback-divider configuration values;
   in response to the determination as to whether the fraction can be represented, computing a set of values for the first frequency-divider configuration value and a set of values for the feedback-divider configuration value based upon the fraction; and
   selecting, from said sets of values and based upon at least one of the set of desired phase-locked loop circuit characteristics, a set of configuration values indicative of low power operation in comparison to other ones of said sets of values.

2. The method of claim 1, wherein the phase-locked loop circuit includes a post-divider and the first frequency-divider is a pre-divider.

3. The method of claim 2, further comprising determining a subset of post-divider configuration values from a range of possible post-divider configuration values; and wherein:
   the step of determining a fraction corresponding to a desired gain of the phase-locked loop circuit is based upon the subset of first frequency-divider configuration values and the subset of post-divider configuration values;
   the step of determining whether the fraction can be represented includes using the subset of post-divider configuration values; and
   the step of computing a set of values for the pre-divider configuration value includes computing a set of values for the post-divider configuration value.

4. The method of claim 1, wherein the at least one of the desired phase-locked loop circuit characteristics includes power consumption of the phase-locked loop circuit.

5. The method of claim 1, wherein the fraction is determined using an iterative algorithm.

6. The method of claim 1, further including computing a fractional-N mode value for compensating for a difference between the first mentioned fraction and a fraction derived from the computed sets of values, in response to the determination that the fraction can be represented.

7. The method of claim 1, wherein the set of desired phase-locked loop circuit characteristics includes constraints for an input to the phase-locked loop circuit, an input to a controllable-oscillator, an output from the controllable-oscillator and an output signal from the phase-locked loop circuit.

8. The method of claim 1, wherein the method is completed in real-time in response to receiving the set of desired phase-locked loop circuit characteristics.

9. A phase-locked loop configuration system consisting of:
   an input configured to receive phase-locked loop characteristics;
   an output configured to provide phase-locked loop configuration data;
   a circuit arrangement configured to determine a low power phase-locked loop configuration for a phase-locked loop circuit having a first frequency-divider, a feedback-divider and a fractional-N mode by performing the steps of:
   determining a subset of first frequency-divider configuration values from a range of possible first frequency-divider configuration values;
   determining a fraction corresponding to a desired gain of the phase-locked loop circuit and based upon the subset of first frequency-divider configuration values;
   determining whether the fraction can be represented using the subset of first frequency-divider configuration values and a range of possible feedback-divider configuration values;
   in response to the determination as to whether the fraction can be represented and based upon the fraction, computing a set of values for the first frequency-divider configuration value and a set of values for the feedback-divider configuration value; and
   selecting, from said sets of values and based upon at least one of a set of phase-locked loop circuit characteristics, a set of configuration values indicative of low power operation in comparison to other ones of said sets of values.

10. The phase-locked loop configuration system claim 9, wherein the phase-locked loop circuit includes a post-divider and the first frequency-divider is a pre-divider.

11. The phase-locked loop configuration system of claim 10, wherein:
   the circuit arrangement determines a subset of post-divider configuration values from a range of possible post-divider configuration values;
   the step of determining a fraction corresponding to a desired gain of the phase-locked loop circuit is based upon the subset of first frequency-divider configuration values and the subset of post-divider configuration values;
   the step of determining whether the fraction can be represented includes using the subset of post-divider configuration values; and
   the step of computing a set of values for the pre-divider configuration value includes computing a set of values for the post-divider configuration value.

12. The phase-locked loop configuration system of claim 9, wherein the at least one of the set of phase-locked loop circuit characteristics includes power consumption of the phase-locked loop circuit.

13. The phase-locked loop configuration system of claim 9, wherein the fraction is determined using an iterative algorithm.

14. The phase-locked loop configuration system of claim 9, further including computing a fractional-N mode value for compensating for a difference between the first mentioned fraction and a fraction derived from the computed sets of values, in response to the determination that the fraction can be represented.

15. The phase-locked loop configuration system of claim 9, wherein the set of phase-locked loop circuit characteristics includes constraints for an input to the phase-locked loop circuit, an input to a frequency-controllable oscillator, an output from the frequency-controllable oscillator and an output signal from the phase-locked loop circuit.

16. The phase-locked loop configuration system of claim 9, wherein the method performed by the determining steps is completed in real-time in response to receiving the set of desired phase-locked loop circuit characteristics.

17. For use with a phase-locked loop circuit having a first frequency-divider, a feedback-divider and a fractional-N mode, a circuit arrangement for determining a low power configuration for the phase-locked loop circuit which meets a set of desired phase-locked loop circuit characteristics, the circuit arrangement comprising:

an input circuit configured to receive phase-locked loop characteristics;

a control circuit configured to determine a phase-locked loop configuration that achieves a low power operation of the phase-locked loop circuit in comparison to other phased-locked loop configurations; and an output circuit configured to provide the phase-locked loop circuit data according to the phase-locked loop configuration.

\* \* \* \* \*